United States Patent
Ogawa et al.

(10) Patent No.: US 7,352,427 B2
(45) Date of Patent: Apr. 1, 2008

(54) DISPLAY DEVICE

(75) Inventors: Kazuhiro Ogawa, Mobara (JP);
Kazuhiko Yanagawa, Mobara (JP)

(73) Assignee: Hitachi, Ltd., Tokyo (JP)

( * ) Notice: Subject to any disclaimer, the term of this patent is extended or adjusted under 35 U.S.C. 154(b) by 337 days.

(21) Appl. No.: 11/075,797

(22) Filed: Mar. 10, 2005

(65) Prior Publication Data
US 2005/0162604 A1 Jul. 28, 2005

Related U.S. Application Data

(62) Division of application No. 10/073,967, filed on Feb. 14, 2002, now Pat. No. 6,961,110.

(30) Foreign Application Priority Data
Feb. 28, 2001 (JP) .............................. 2001-053541

(51) Int. Cl.
*G02F 1/13* (2006.01)
*H05K 1/03* (2006.01)
(52) U.S. Cl. ...................... 349/150; 349/152; 174/260
(58) Field of Classification Search ........ 349/149–152; 174/260; 361/760–761
See application file for complete search history.

(56) References Cited

U.S. PATENT DOCUMENTS

| | | | |
|---|---|---|---|
| 5,877,543 A | 3/1999 | Matsubara | |
| 6,195,148 B1 | 2/2001 | Sasuga | |
| 6,738,123 B1 | 5/2004 | Takahashi | |
| 6,822,720 B2 * | 11/2004 | Ueda et al. | 349/152 |
| 6,835,896 B2 * | 12/2004 | Hwang et al. | 174/255 |
| 7,102,721 B2 * | 9/2006 | Ueda et al. | 349/152 |
| 7,133,037 B2 * | 11/2006 | Kim et al. | 345/206 |
| 2002/0097366 A1 * | 7/2002 | Moon | 349/149 |

FOREIGN PATENT DOCUMENTS

| | | |
|---|---|---|
| EP | 0 795 772 | 11/2002 |
| JP | 5-100239 | 4/1993 |
| JP | 5-308091 | 11/1993 |
| JP | 5-323346 | 12/1993 |
| JP | 5-323348 | 12/1993 |
| JP | 7-161771 | 6/1995 |
| JP | 8-78471 | 3/1996 |
| JP | 9-82751 | 3/1997 |
| JP | 10-261853 | 9/1998 |
| JP | 11-209713 | 8/1999 |
| JP | 11-330154 | 11/1999 |

* cited by examiner

*Primary Examiner*—Toan Ton
(74) *Attorney, Agent, or Firm*—Antonelli, Terry, Stout & Kraus, LLP.

(57) ABSTRACT

A display device which provides reliable connection between a semiconductor device and a printed circuit board includes a display panel, a printed circuit board disposed close to the display panel, and a semiconductor device of a film carrier type which is disposed to lie between the display panel and the printed circuit board, and terminals of the semiconductor device are respectively connected by an anisotropic conductive film to terminals of the printed circuit board that are disposed in opposition to the respective terminals of the semiconductor device.

2 Claims, 6 Drawing Sheets

DISPLAY DEVICE

CROSS REFERENCE TO RELATED APPLICATION

This is a division of U.S. application Ser. No. 10/073,967, filed Feb. 14, 2002 now U.S. Pat. No. 6,961,110, and is related to copending U.S. application Ser. No. 10/806,097, filed Mar. 23, 2004, which is a division of U.S. application Ser. No. 10/073,967, the subject matter of which is incorporated by reference herein.

BACKGROUND OF THE INVENTION

The present invention relates to an active matrix type liquid crystal display device.

An active matrix type liquid crystal display device includes transparent substrates disposed in opposition to each other with a liquid crystal material interposed therebetween; gate signal lines disposed so as to extend in the x direction and to be juxtaposed in the y direction; drain signal lines disposed so as to extend in the y direction and to be juxtaposed in the x direction, the gate signal lines and the drain signal lines being formed on a liquid-crystal-Side surface of either one of the transparent substrates; and pixel areas, each formed by an area surrounded by adjacent ones of the gate signal lines and adjacent ones of the drain signal lines.

These pixel areas are disposed in matrix form, and a liquid crystal display region is formed by an aggregation of the pixel areas.

Each of the pixel areas is provided with a switching element, which is operated by a scanning signal supplied from one of the adjacent gate signal lines, and a pixel electrode, which is supplied with a video signal from one of the adjacent drain signal lines via the switching element.

This pixel electrode is constructed to control the optical transmissivity of the liquid crystal material by causing an electric field to be generated between the pixel electrode and a counter electrode formed on either one of the transparent substrates.

The gate signal lines and the drain signal lines are disposed so as to extend to the outside of the liquid crystal display region of the liquid crystal display device, and scanning signals applied to the gate signal lines are supplied from a scanning signal driver circuit connected to the gate signal lines, while video signals applied to the drain signal lines are supplied from a video signal driver circuit connected to the drain signal lines.

The liquid crystal display device has a plurality of scanning signal driver circuits and video signal driver circuits, and mutually adjacent ones of the scanning signal lines or drain signal lines are grouped and each group is assigned to one scanning signal driver circuit or one video signal driver circuit.

One construction of such a driver circuit includes a semiconductor device formed by a so-called tape carrier method, which has a construction such that a semiconductor chip is mounted on a film-like substrate and interconnection layers, which are respectively connected to the bumps of the semiconductor chip, are formed along a surface of the-film-like substrate, and the extending ends of the respective interconnection layers are connected to a terminal at each end of the interconnection layers.

Solder is used for the connection between the input terminals of the semiconductor device and terminals of the printed circuit board, whereas the connection between the output terminals of the semiconductor device and terminals of the liquid crystal display panel is provided by a so-called anisotropic conductive film ACF.

SUMMARY OF THE INVENTION

However, in the recent trends toward far higher resolutions and far more colors of liquid crystal display devices, it has been pointed out that, as the number of input terminals and the number of output terminals increase in a semiconductor device, a problem, such as a short between adjacent terminals, occurs during the connection between the terminals of the semiconductor device and those of a printed circuit board.

The object of the present invention is to solve such a problem and to provide a liquid crystal display device with reliable connection between a semiconductor device and a printed circuit board.

Representative method to solve the above-mentioned problem is to provide a liquid crystal display device according to the invention that includes, for example, a liquid crystal display panel, a printed circuit board, and a semiconductor device of a tape carrier type, which is disposed to lie between the liquid crystal display panel and the printed circuit board, and wherein input terminals of the semiconductor device are respectively connected by an anisotropic conductive film to terminals of the printed circuit board that are disposed in opposition to the respective input terminals of the semiconductor device.

In a liquid crystal display device constructed in this manner, it is possible to prevent a short circuit condition between adjacent terminals during the connection between the input terminals of the semiconductor device and the terminals of the printed circuit board, even if the input terminals of the semiconductor device become large in number and narrow in pitch.

The reason for this is that the size of conductive beads contained in the anisotropic conductive film ACF is small, and adjacently disposed terminals are not electrically connected by the conductive beads at the time when the semiconductor device is secured to the printed circuit board by thermocompression bonding via the anisotropic conductive film ACF.

On the other hand, in the case of using solder to connect the terminals of the semiconductor device and those of the printed circuit board, the solder spreads horizontally during bonding of the semiconductor device to the printed circuit board. This spread of solder reaches other adjacent terminals and causes a short circuit between adjacent terminals.

The invention mentioned in detail in the specification can solve this short circuit.

These and other objects, features and advantages of the present invention will become more apparent from the following description when taken in conjunction with the accompanying drawings.

BRIEF DESCRIPTION OF THE DRAWINGS

The invention will become more readily appreciated and understood from the following detailed description of preferred embodiments of the invention, when taken in conjunction with the accompanying drawings, in which.

DETAILED DESCRIPTION OF THE INVENTION

Preferred embodiments of a liquid crystal display device according to the invention will be described below with reference to the accompanying drawings.

Embodiment 1

<<Equivalent Circuit>>

Figure 2:
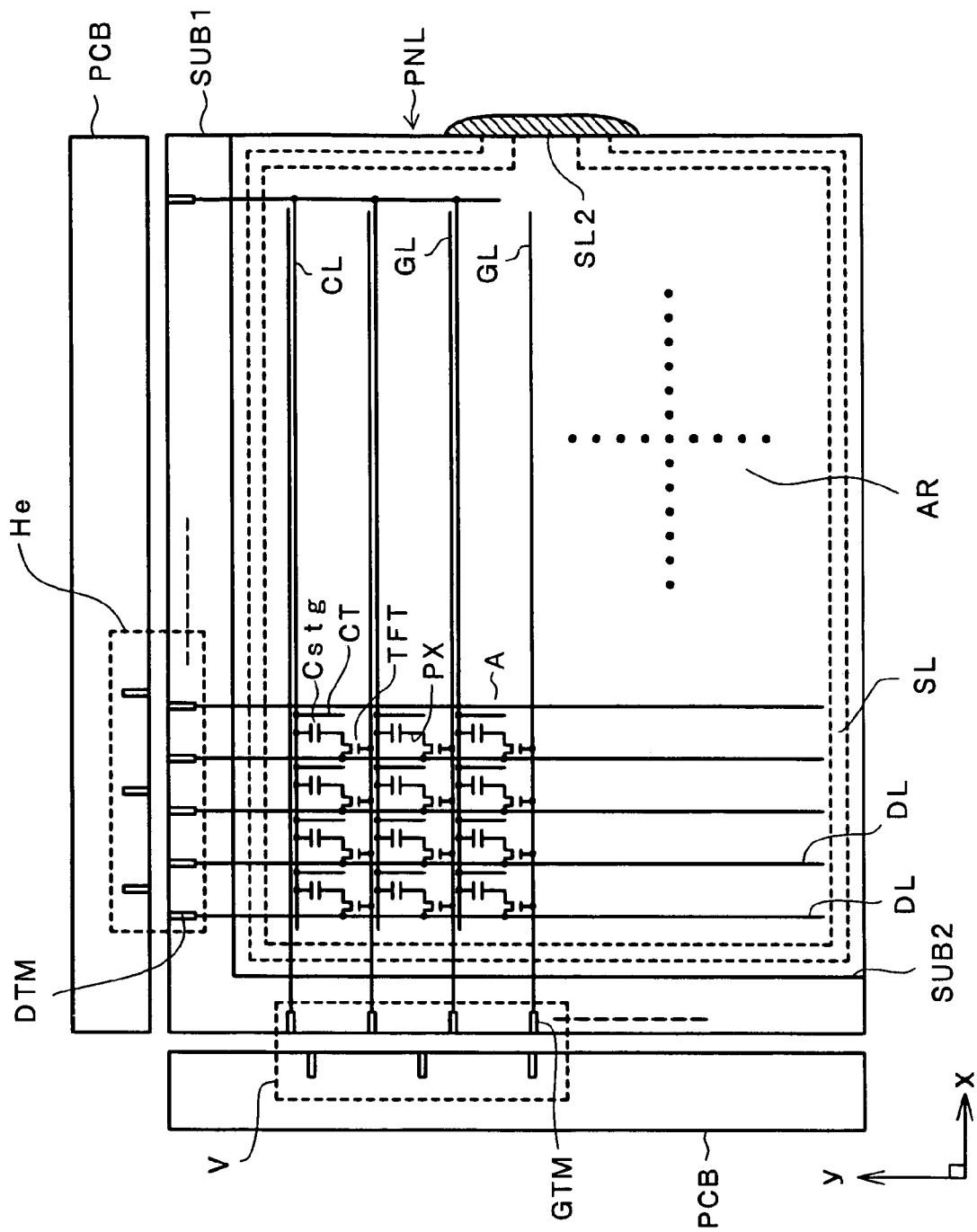
FIG. 2 is an equivalent circuit diagram of an embodiment of the liquid crystal display device according to the invention.

FIG. 2 is a view showing the equivalent circuit of a liquid crystal display device according to the invention. In FIG. 2, the circuit diagram is arranged to correspond to the actual geometrical layout of the liquid crystal display device. Transparent substrate SUB1 is disposed in opposition to another transparent substrate SUB2 with a liquid crystal material interposed therebetween.

Gate signal lines GL and drain signal lines DL are formed on a liquid-crystal-side surface of the transparent substrate SUB1. The gate signal lines GL are disposed so as to extend in the x direction and to be juxtaposed in the y direction. The drain signal lines DL are insulated from the gate signal lines GL and are disposed so as to extend in the y direction and to be juxtaposed in the x direction. Rectangular areas, each of which is surrounded by adjacent ones of the gate signal lines GL and adjacent ones of the drain signal lines DL constitute pixel areas, respectively, and a liquid crystal display region AR is formed by an aggregation of these pixel areas.

A thin film transistor TFT and a pixel electrode PX are formed in each of the pixel areas. The thin film transistor TFT is driven by supply of a scanning signal (voltage) from one of the adjacent gate signal lines GL, and a video signal (voltage) is supplied to the pixel electrode PX from one of the adjacent drain signal lines DL via the thin film transistor TFT.

A capacitance element Cstg is formed between the pixel electrode PX and a counter voltage signal line CL, which will be described later, to store a video signal supplied to the pixel electrode for a along time when the thin film transistor TFT is turned off.

The pixel electrodes PX in each of the pixel areas are arranged adjacent to the counter electrode CT to generate an electric field between the respective pixel electrodes PX and counter electrodes CT. The optical transmissivity of the liquid crystal is controlled by the electric fields, which have a substantial component parallel to the transparent substrate SUB1.

One end of each of the gate signal lines GL is formed to extend from the liquid crystal display region AR to one side (in FIG. 2, the left-hand side) of the transparent substrate SUB1, and this extending portion is formed as a terminal part GTM, which is connected to an output terminal of a vertical scanning driver circuit V.

In addition, one end of each of the drain signal lines DL is formed to extend from the liquid crystal display region AR to one side (in FIG. 2, the top side) of the transparent substrate SUB 1, and this extending portion is formed as a terminal part DTM, which is connected to an output terminal of a video signal driver circuit He.

A plurality of vertical scanning driver circuits V are disposed so as to be aligned in the y direction as viewed in FIG. 2; and, a predetermined number of mutually adjacent ones of the gate signal lines GL are grouped, and a respective one of the vertical scanning driver circuits V is assigned to the predetermined number of gate signal lines GL of each respective group.

Similarly, a plurality of video signal driver circuits He are disposed so as to be aligned in the x direction, as viewed in FIG. 2; and, a predetermined number of mutually adjacent ones of the drain signal lines DL are grouped, and a respective one of the video signal driver circuits He is assigned to the predetermined number of drain signal lines DL of each respective group.

Figure 1:
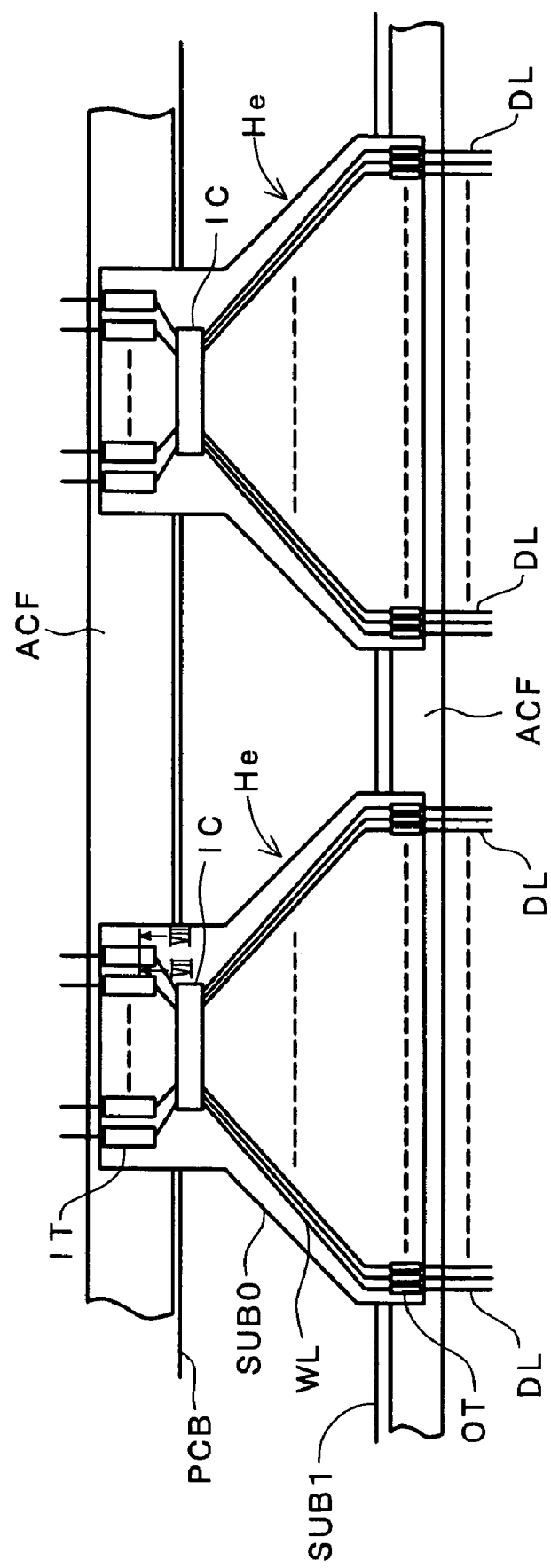
FIG. 1 is a plan view showing a portion of an embodiment of the liquid crystal display device according to the invention.

FIG. 1 is a plan view showing the details of the video signal driver circuits He, by way of example, and this figure shows two juxtaposed ones of the video signal driver circuits He.

Each of the video signal driver circuits He is made up of a semiconductor device manufactured by a so-called tape carrier method. A semiconductor chip IC is mounted on a film-like substrate SUB0, and the input bumps of the semiconductor chip IC are respectively led out to input terminals IT via interconnection layers WL formed on a surface of the substrate SUB0, while the output bumps of the semiconductor chip IC are respectively led out to output terminals OT via the interconnection layers WL.

The input terminals IT are formed so as to be juxtaposed along one side portion of the substrate SUB0, while the output terminals OT are formed so as to be juxtaposed along the other side portion opposite to the one side portion of the substrate SUB0. The input terminals IT are smaller in number than the output terminals OT, and, accordingly, the width of each of the input terminals IT is slightly larger than that of each of the output terminals OT.

In each of the video signal driver circuits He constructed in this manner, the respective output terminals OT are connected to the drain terminal parts DTM of the corresponding drain signal lines DL via an anisotropic conductive film ACF, and the respective input terminals IT are connected via an anisotropic conductive film ACF to corresponding terminals of a printed circuit board PCB (in this specifications the term "liquid crystal display panel" indicates a construction which includes the transparent substrates SUB1 and SUB2 disposed with the liquid crystal material interposed therebetween, as well as material layers formed on the surfaces of each of the transparent substrates SUB1 and SUB2).

A circuit for driving the video signal driver circuits He is mounted on the printed circuit board PCB, and signals which also include electric power are inputted to the video signal driver circuits He via the printed circuit board PCB.

Each of the anisotropic conductive films ACF is made of a resin film which contains a multiplicity of minute conductive beads. The video signal driver circuits He are positioned with respect to, for example, the printed circuit board PCB via these anisotropic conductive films ACF and are secured to the printed circuit board PCB by thermocompression bonding, whereby each terminal of the video signal driver circuits He is electrically connected to its opposed terminal of the printed circuit board PCB via the conductive beads.

The vertical scanning driver circuits V only differ from the video signal driver circuits He in the circuit constructions of semiconductor chips, and are constructed in a manner similar to the above-described one.

<<Construction of Pixel>>

Figure 3:
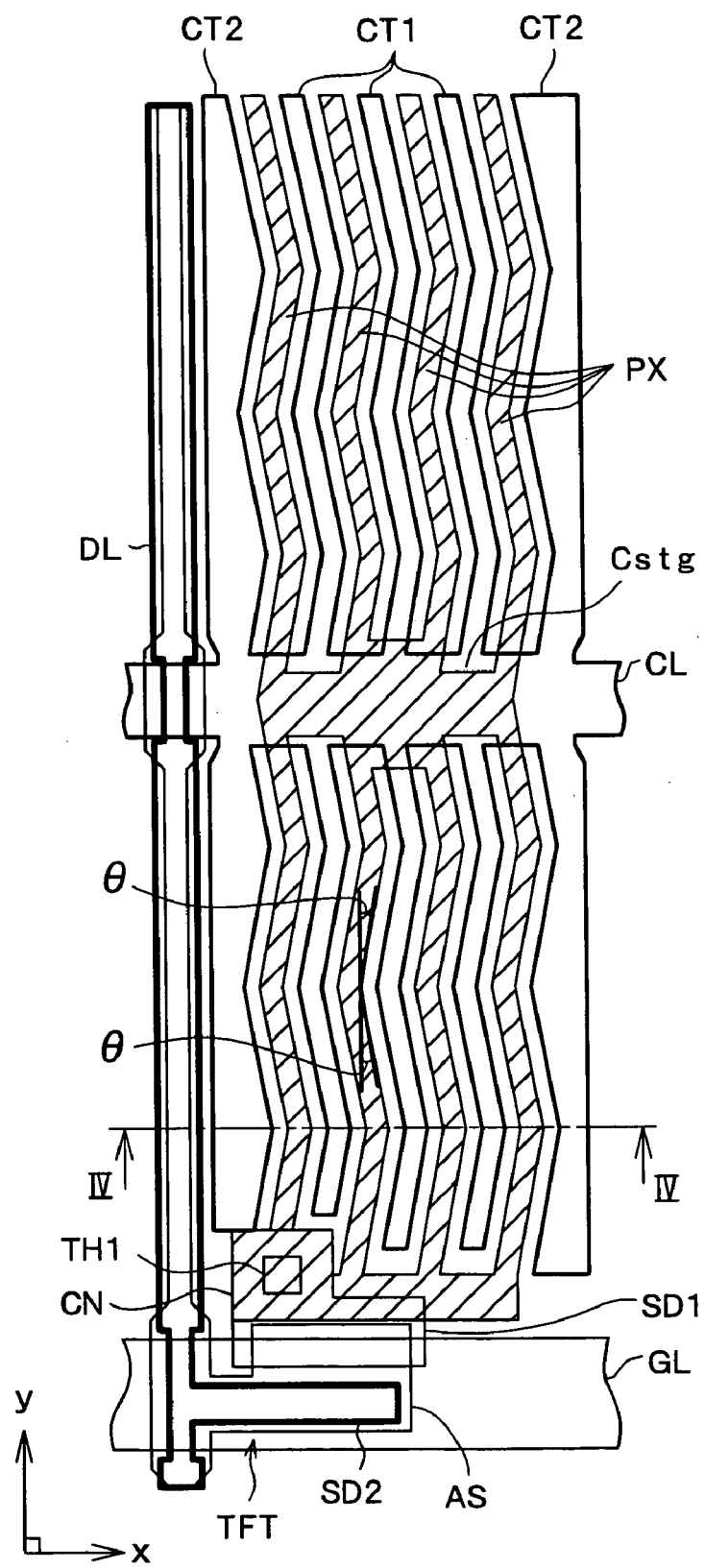
FIG. 3 is a plan view showing an embodiment of a pixel of the liquid crystal display device according to the invention.
Figure 4:
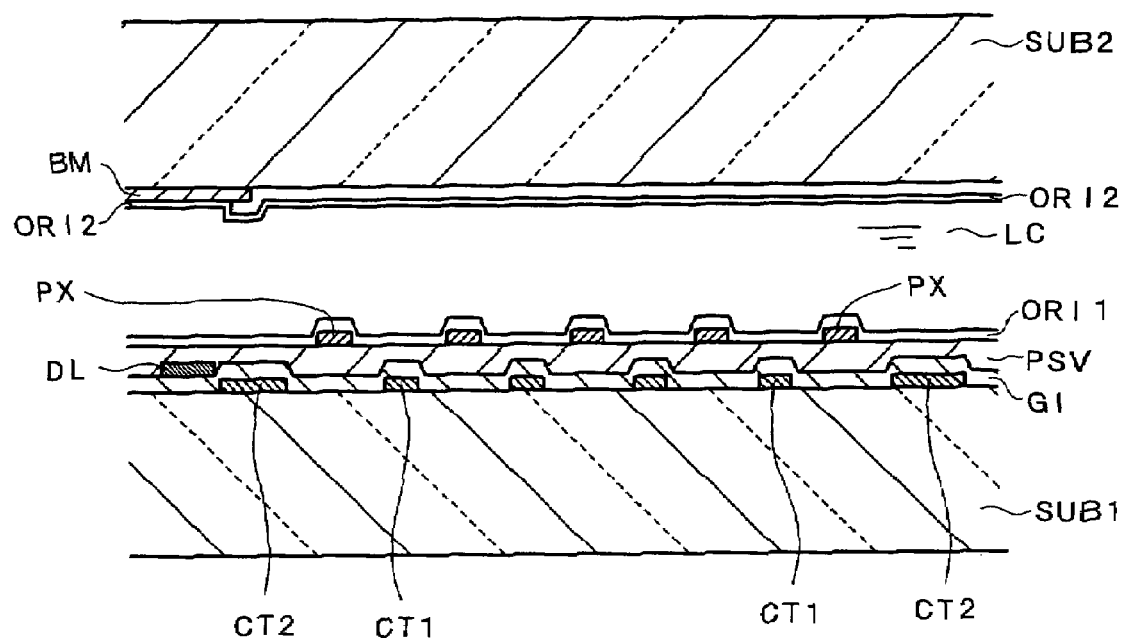
FIG. 4 is a cross-sectional view taken along line IV-IV of FIG. 3.

FIG. 3 is a plan view showing one example of one of the pixels of the liquid crystal display device according to the invention. FIG. 4 shows a cross-sectional view taken along line IV-IV of FIG. 3.

FIG. 3 is a view of the construction of one pixel on the liquid-crystal-side surface of the transparent substrate SUB1, which is one of the transparent substrates SUB1 and SUB2 disposed in opposition to each other with the liquid crystal material interposed therebetween. The pixels are arranged in matrix form. Accordingly, each of other pixels, which are respectively positioned on the top, bottom, right and left sides of the pixel area shown in FIG. 3 also has a similar construction.

A gate signal line GL, which is disposed so as to extend in the x direction of FIG. 3, is formed on the surface of the transparent substrate SUB1 on the bottom side of the illustrated pixel area.

This gate signal line GL is formed to surround the pixel area together with a gate signal line (not shown) which corresponds to a pixel area positioned on the top side of the pixel area, a drain signal line DL which will be described later, and a drain signal line (not shown) which corresponds to a pixel area positioned on the right-hand side of the pixel area.

A counter voltage signal line CL, which is disposed so as to extend in the x direction in FIG. 3, is formed in the middle of the pixel area. This counter voltage signal line CL is formed, for example, in the same process as the gate signal line GL. In this case, the material of the counter voltage signal line CL is the same as that of the gate signal line GL.

The counter voltage signal line CL is formed integrally with the counter electrode CT, and a plurality of counter electrodes CT are formed so as to extend in the upward and downward directions (in the y direction in FIG. 3) from the counter voltage signal line CL and to be juxtaposed in the x direction.

Each of the counter electrodes CT is formed to have a zigzag shape in its extension direction. This construction will be described later in detail in connection with the pixel electrode PX.

An insulating film GI made of, for example, SiN is formed to cover the gate signal line GL and the counter voltage signal line CL (the counter electrodes CT) on the surface of the transparent substrate SUB1, on which the gate signal line GL and the counter voltage signal line CL (the counter electrodes CT) are formed in the above-described manner.

This insulating film GI has the function of an interlayer insulating film disposed between the drain signal line DL (which will be described later) and the gate signal line GL, as well as the counter voltage signal line CL, the function of a gate insulating film with respect to the thin film transistor TFT, which will be described later, and the function of a dielectric film with respect to the capacitance element Cstg, which will be described later.

A semiconductor layer AS, which is made of, for example, amorphous Si (a-Si), is formed on the surface of the insulating film GI in a portion thereof which is superposed on the gate signal line GL.

This semiconductor layer AS constitutes a semiconductor layer of the thin film transistor TFT, and a drainelectrode SD1 and a source electrode SD2 are formed on the top surface of the semiconductor layer AS, thereby forming a MIS type transistor having a reverse-staggered structure, which uses a part of the gate signal line GL as its gate electrode.

The drain electrode SD2 and the source electrode SD1 are formed at the same time as, for example, the drain signal line DL. Specifically, the drain signal line DL is formed to extend in the y direction in FIG. 3; and, at this time, the source electrode SD2 is formed by extending a part of the drain signal line DL onto the top surface of the semiconductor layer AS, and the source electrode SD1 is formed in a portion which is spaced apart from the drain electrode SD2 by a distance corresponding to the channel length of the thin film transistor TFT.

The source electrode SD1 is disposed so as to be connected to the pixel electrode PX via a protective film PSV, which will be described later, and is slightly extended toward the middle of the pixel area to form a contact portion CN.

The protective film PSV, which is made of, for example, a resin film (or a stacked structure in which a SiN film, SiN and a resin film are stacked in that order), is formed to cover the thin film transistor TFT and other elements on the surface of the transparent substrate SUB1 on which the thin film transistor TFT is formed in the above-described manner. This protective film PSV is formed chiefly in order to prevent the thin film transistor TFT from coming into direct contact with the liquid crystal.

A plurality of pixel electrodes PX, which are disposed to as to extend in the y direction and to be juxtaposed in the x direction in FIG. 3, are formed on the top surface of the protective film PSV, and these pixel electrodes PX are formed so that the pixel electrodes PX and the counter electrodes CT are alternately arranged with a space being interposed between each of the counter electrodes CT and the adjacent ones of the pixel electrodes PX.

The pixel electrodes PX are constructed to be electrically connected in the pattern wherein they are connected in pairs in an area which is superposed on the counter voltage signal line CL, and the pixel electrodes PX are connected to the source electrode SD1 of the thin film transistor TFT via a contact hole TH1, which is formed in the protective film PSV.

Accordingly, a video signal from the drain signal line DL is supplied to the pixel electrodes PX via the thin film transistor TFT, which is driven by the supply of a scanning signal from the gate signal line GL. In addition, the pixel electrodes PX are arranged to òcause electric fields to be generated between the respective pixel electrodes PX and the adjacent ones of the counter electrodes CT, to each of which a signal which serves as a reference is to be supplied.

The capacitance element Cstg is formed between the connection portions of the respective pairs of pixel electrodes PX and the counter voltage signal line CL, and the capacitance element Cstg has the function of enabling a video signal to be stored in the pixel electrodes PX for a comparatively long time after the thin film transistor TFT is turned off.

Each of the pixel electrodes PX that extend in the y direction in FIG. 3 is formed to have a zigzag shape such that it is extended from one end toward the other end in a state where it is bent first in a θ direction (with respect to the y direction in FIG. 3), then in a −θ direction (with respect to the y direction in FIG. 3), and again in the θ direction (with respect to the y direction in FIG. 3). The counter electrodes CT are bent similarly to the pixel electrodes PX and are formed in a pattern in which, if either the pixel electrodes PX or the counter electrodes CT are shifted in the x direction in FIG. 3, both electrodes PX and CT can be superposed on one another.

The reason why the pixel electrodes PX and the counter electrodes CT are formed in according to the above-described pattern is that this embodiment adopts a so-called multi domain scheme in which domains are formed so that the directions of the electric fields to be generated between the pixel electrodes PX and the counter electrodes CT differ from domain to domain, thereby canceling variations in color tone which occur when the display area is viewed in different directions with respect to the display surface of the liquid crystal display device.

The counter electrodes CT (CT2) positioned on opposite sides (rightward and leftward) of the pixel areas differ in a pattern from the other counter electrodes CT (CT1); that is, each of the counter electrodes CT (CT2) has a side that extends in parallel with the adjacent drain signal line DL and a comparatively large width with respect to the other counter electrodes CT (CT1).

These counter electrodes CT2 prevent light leakage by reducing the gaps between the respective counter electrodes CT2 and the adjacent drain signal lines DL, and they provide the shield functions of preventing electric fields generated from the adjacent drain signal lines DL from terminating at the pixel electrodes PX.

An alignment film ORI1, which also covers the pixel electrodes PX, is formed on the surface of the transparent substrate SUB1 on which the pixel electrodes PX are formed in this manner. This alignment film ORI1 is a film which is in direct contact with a liquid crystal LC so as to restrict the initial alignment direction of the molecules of the liquid crystal LC. The rubbing direction of the alignment film ORI1 is made coincident with the direction of extension of the drain signal lines DL in the case of a p-type liquid crystal, or the direction of extension of the gate signal lines GL in the case of an n-type liquid crystal.

A black matrix BM is formed to separate adjacent pixels from one another on the liquid-crystal-side surface of the transparent substrate SUB2, which is disposed in opposition to the transparent substrate SUB1 constructed in this manner, with the liquid crystal material LC being interposed therebetween. Color filters FIL for corresponding colors are respectively formed in the apertures of the black matrix BM (that serve as substantial pixel areas, respectively).

An alignment film ORI2, which also covers the black matrix BM and the color filters FIL, is formed, and the rubbing direction of the alignment film ORI2 is made coincident with that of the alignment film ORI1 formed on the transparent substrate SUB1.

In the above-described construction, both the pixel electrode PX and the counter electrode CT may be formed of an opaque metal film made of, for example, Cr (or a Cr alloy), but at least either one of the pixel electrode PX and the counter electrode CT may also be formed of a transparent metal film made of, for example, ITO (INDIUM-TIN-OXIDE).

In addition, in the case where the pixel electrodes PX and the counter electrodes CT are formed of a transparent metal, the so-called aperture ratio of each pixel is improved to a great extent.

<<Construction of Driver Circuit>>

As shown in FIG. 1, each of the video signal driver circuits He is disposed to lie between the liquid crystal display panel PNL (more exactly, transparent substrate SUB 1) and the printed circuit board PCB, and, as described above, the input terminals IT are electrically connected to the respective terminals of the printed circuit board PCB via the anisotropic conductive film ACF.

In this portion, connection has heretofore been provided by solder. However, in the recent trends toward far higher resolutions of liquid crystal display devices, with an increase in the number of the output terminals OT of each of the video signal driver circuits He, the length between input terminals IT becomes narrow.

As a result, the problem occurs that adjacent terminals are shorted by solder which tends to spread horizontally during bonding of the video signal driver circuits He to the printed circuit board PCB.

In addition, even if such a problem does not occur, in a case where residual solder exists between adjacent terminals, a short is liable to occur when an external force is applied to the terminals or to a nearby location.

To solve these problems, the anisotropic conductive film ACF is used for the connection between the input terminals IT of the video signal driver circuits He and the respective terminals of the printed circuit board PCB.

The conductive beads contained in the anisotropic conductive film ACF are made small in size so that when the video signal driver circuits He are secured to the printed circuit board PCB via the anisotropic conductive film ACF by thermocompression bonding, the conductive beads are prevented from electrically connecting terminals disposed adjacent to one another.

Figure 5:
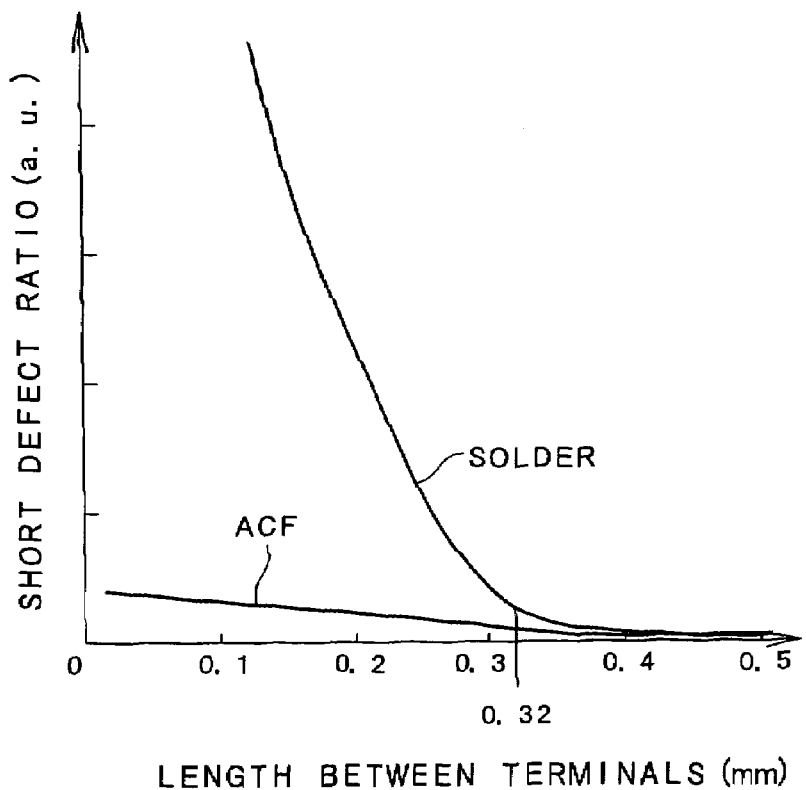
FIG. 5 is a graph showing an advantage of the liquid crystal display device according to the invention.

FIG. 5 is a graph showing a short defect ratio against the length between the terminals in a case where solder is used and in a case where the anisotropic conductive film ACF is used.

In the case where solder is used, when the length between the terminals is 0.40 mm or less, the short defect ratio sharply increases (particularly when it is 0.32 mm or less, the short defect ratio remarkably increases), whereas, in the case where the anisotropic conductive film ACF is used, the short defect ratio only increases extremely gently. From this fact, it is seen that when the length between the terminals is 0.40 mm or less (or 0.32 mm or less), it is effective to use the anisotropic conductive film ACF. The term "length between terminals" as used herein represents the distance between mutually opposed sides of adjacent ones of terminals disposed in parallel with one another.

In addition, the connection between the input-terminals of the vertical scanning driver circuits V and individual terminals of a printed circuit board PCB is provided via an anisotropic conductive film ACF.

Incidentally, in the following description of individual embodiments, reference will be made to the video signal driver circuits He by way of example, however, the invention can also be applied to the vertical scanning driver circuits V.

Embodiment 2

An important aspect of this embodiment is that the anisotropic conductive film ACF is being used for the connection between the terminals of the video signal driver circuits He and those of the printed circuit board PCB in the case where the distance between the terminals of each of the video signal driver circuits He is 0.20 mm or less.

The embodiment constructed in this manner can, of course, serve the advantage of Embodiment 1, and, in addition, it is capable of solving a problem due to the misregistration of the video signal driver circuits He with respect to the liquid crystal display panel PNL.

Specifically, a misregistration of approximately 0.10 mm normally occurs during the positioning of the video signal driver circuits He with respect to the liquid crystal display panel PNL. In the case where individual terminals of the video signal driver circuits He and those of the liquid crystal display panel PNL are connected by using solder on condition that the length between such terminals is 0.20 mm or less, the solder spreads horizontally in its molten state and short circuits frequently occur between these terminals.

Accordingly, in the case where the length between the terminals is 0.20 mm or less, the above-described problem can be solved by using the anisotropic conductive film ACF for the connection between the video signal driver circuits He and the liquid crystal display panel PNL.

Embodiment 3

Figure 6:
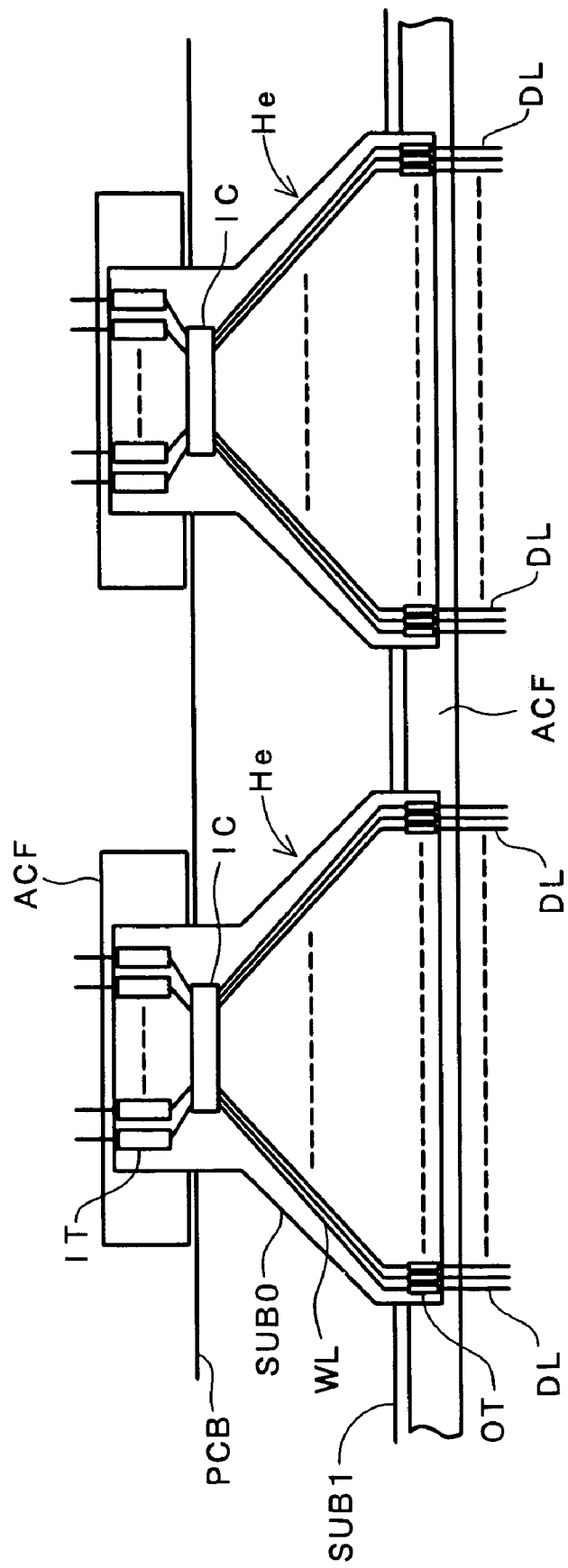
FIG. 6 is a plan view showing the essential portion of another embodiment of the liquid crystal display device according to the invention.

An important aspect of this embodiment is that the connection between the individual terminals of each of the video signal driver circuits He and those of the printed circuit board PCB is provided via the anisotropic conductive film ACF, and the anisotropic conductive film ACF is separated for each of the video signal driver circuits He. Specifically, as shown in FIG. 6, the anisotropic conductive film ACF used for each of the video signal driver circuits He is physically independent from those used for other adjacent ones.

The anisotropic conductive film ACF is, as described above, made of a resin film in which conductive beads are scattered. Thus, in the case of a portion in which no conductive beads exist in the resin, defective contact occurs in the portion between terminals on one side of the anisotropic conductive film ACF and terminals on the other side.

In a case where such an anisotropic conductive film ACF is formed in common with the individual video signal circuits He, not only the video signal driver circuit He located where defective contact is discovered, but also all other video signal driver circuits He must be peeled. That is because the anisotropic conductive film ACF has the nature of a thermally dissolutive adhesive. This leads to a decrease in work efficiency.

For this reason, the anisotropic conductive film ACF is separately used for each of the video signal driver circuits He in this embodiment. Accordingly, for example, if a defective contact occurs between a terminal of one of the video signal driver circuits He and a terminal of the printed circuit board PCB to which the one is to be connected, only the one video signal driver circuit He can be peeled, and a repair can be made with a new anisotropic conductive film ACF, with the other video signal driver circuits He remaining unchanged.

Accordingly, it goes without saying that one video signal driver circuit He need not be assigned to one separate anisotropic conductive film ACF, and two or more video signal driver circuits He may be assigned to one anisotropic conductive film ACF.

On the other hand, for the connection between each of the video signal driver circuits He and the liquid crystal display panel PNL, one anisotropic conductive film ACF is used in common with all the video signal driver circuits He. In other words, it is preferable when the respective video signal driver circuits He are connected to the liquid crystal display panel PNL in different portions of one anisotropic conductive film ACF. The reason for this is that it is wise to give preference to work efficiency during the thermocompression bonding of semiconductor devices to a liquid crystal display panel via an anisotropic conductive film, because the liquid crystal display panel is formed of glass having a low coefficient of thermal expansion and the rate of occurrence of defects is small.

However, even in the case of the connection between the video signal driver circuits He and the liquid crystal display panel PNL, the anisotropic conductive film ACF may, of course, be separated similarly to those used on the printed circuit board PCB.

Embodiment 4

An important aspect of this embodiment is that an anisotropic conductive film ACF, which provides connection between the terminals of the liquid crystal display panel PNL and the video signal driver circuits He, differs in physical property from the anisotropic conductive film ACF which provides connection between the terminals of the printed circuit board PCB and those of the video signal driver circuits He.

Specifically, as one example, the anisotropic conductive film ACF, which provides connection between the terminals of the printed circuit board PCB and those of the video signal driver circuits He, is formed to have a lower melting point than the anisotropic conductive film ACF which provides connection between the terminals of the liquid crystal display panel PNL and those of the video signal driver circuits He.

Accordingly, it is possible to lower the temperature of the thermocompression bonding of the video signal driver circuits He to the printed circuit board PCB via the anisotropic conductive film ACF, whereby it is possible to restrain any influence due to a large difference in coefficient of thermal expansion between the printed circuit board PCB and, the video signal driver circuits He.

As for the connection between the liquid crystal display panel PNL and the video signal driver circuits He, the coefficient of thermal expansion of the liquid crystal display panel PNL is low and correction for expansion can be easily made. However, the connection between the printed circuit board PCB and the video signal driver circuits He entails the problem that such correction is difficult, because of the large coefficient value of thermal expansion. By using this embodiment, an expansion of the pitch between terminals can be decreased during thermal attachment, and this is able to prevent the occurrence of a defective connection due to the resultant deviation.

In this case, it is advantageous that, after connection has been provided between the liquid crystal display panel PNL and the video signal driver circuits He, connection is provided between the video signal driver circuits He and the printed circuit board PCB.

Assuming that the liquid crystal display device is manufactured in reverse order, there is a risk that the printed circuit board PCB is melted by heat generated during the thermocompression bonding of the liquid crystal display panel PNL and the video signal driver circuits He. Even if no such melting occurs, the connection between the video signal driver circuits He and the printed circuit board PCB via the anisotropic conductive film ACF may be damaged.

In addition, as another embodiment, the dispersion density of conductive beads (the number of conductive beads per unit area) contained in the anisotropic conductive film ACF which provides connection between the terminals of the liquid crystal display panel PNL and those of the video signal driver circuits He is made higher than the dispersion density of conductive beads contained in the anisotropic conductive film ACF, which provides the terminals of the printed circuit board PCB and those of the video signal driver circuits He.

The output terminals of each of the video signal driver circuits He (the terminals located on the side of the liquid crystal display panel PNL) are formed to be large in number and small in width. Thus, in case the conductive beads of the anisotropic conductive film ACF are not uniformly scattered and the conductive beads do not exist in a portion of the anisotropic conductive film ACF, defective contact easily occurs in this portion. For this reason, the quantity of conductive beads contained in the anisotropic conductive film ACF, which provides connection between the terminals of the liquid crystal display panel PNL and those of the video signal driver circuits He, is made larger.

On the other hand, the input terminals of each of the video signal driver circuits He show a large extent of misregistration with respect to the terminals of the printed circuit board PCB. Assuming that the quantity of conductive beads to be interposed between the input terminals of each of the video signal driver circuits He and the terminals of the printed circuit board PCB is increased in the anisotropic conductive film ACF, short circuits easily occur between adjacent terminals as the result of the misregistration, as well as horizontal travels or aggregations of donductive beads during thermocompression bonding. This is why the quantity of the conductive beads of the anisotropic conductive film ACF located at the input terminals of the video signal driver circuits He needs to be reduced.

In addition, as another embodiment, the conductive beads contained in the anisotropic conductive film ACF, which provides connection between the terminals of the liquid crystal display panel PNL and the terminals of the video signal driver circuits He, are made smaller in size than those contained in the anisotropic conductive film ACF, which provides connection between the terminals of the printed circuit board PCB and those of the video signal driver circuits He.

The output terminals of each of the video signal driver circuits He (the terminals located on the side of the liquid crystal display panel PNL) are formed to be large in number and small in width. Accordingly, the conductive beads contained in the anisotropic conductive film ACF are made small in size to correspond to the widths of the terminals. Assuming that the conductive beads are formed to be large in size, the probability that the conductive beads are disposed between opposed terminals becomes low, and there is a risk that defective contact occurs.

Figure 7:
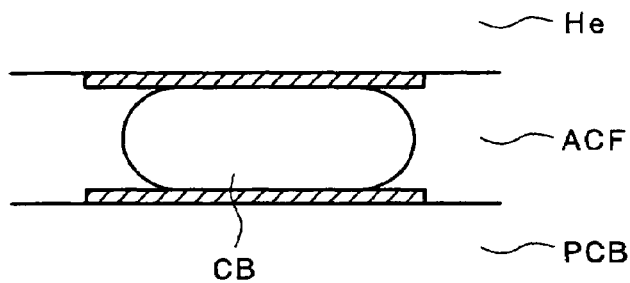
FIG. 7 is a plan view showing a portion of another embodiment of the liquid crystal display device according to the invention.

On the other hand, the conductive beads contained in the anisotropic conductive film ACF, which provides a connection between the input terminals of the video signal driver circuits He and the terminals of the printed circuit board PCB, are made large in size; and, as shown in FIG. 7, which is a cross-sectional view taken along line VII-VII of FIG. 1, after thermocompression bonding, a conductive bead CB is deformed into an oval shape, so that the area of contact between opposed terminals can be increased.

Since the liquid crystal display device is constructed to supply electric power from the printed circuit board PCB to the video signal driver circuits He, this is extremely advantageous in terms of characteristics to lower the resistance at such a terminal connection portion in this manner.

Embodiment 5

This embodiment relates to the sizes of the conductive beads contained in the anisotropic conductive film ACF, which provides the connection between the input terminals of the video signal driver circuits He and those of the printed circuit board PCB.

Figure 8:
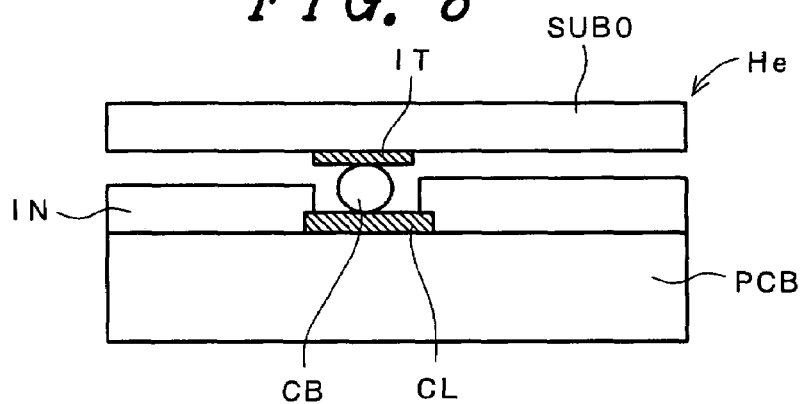
FIG. 8 is a plan view showing a portion of another embodiment of the liquid crystal display device according to the invention.

As shown in FIG. 8, a conductive film CL is formed as an interconnection pattern on the surface of the printed circuit board PCB, and an insulating film IN is formed, which is opened in the area of a terminal part of the printed circuit board PCB.

This insulating film IN is made of a film-like sheet stuck to the printed circuit board PCB, and has a thickness of approximately 50 μm.

The size of the conductive bead CB contained in the anisotropic conductive film ACF is set to be not smaller than the film thickness of the insulating film IN.

Accordingly, the conductive bead CB of the anisotrepic conductive film ACF disposed in the opening of the insulating film IN, which exposes the terminal part, has a vertex portion fully projected from the surface of the insulating film IN, whereby it is possible to achieve the advantage that connection is reliably provided between the conductive bead CB and a terminal of the video signal driver circuit He.

In addition, the terminals of the printed circuit board PCB are constructed to be supplied with electric power, and by taking into account the fact that the conductive beads of the anisotropic conductive film ACF are, as described above, deformed into oval shapes by the thermocompression bonding of the video signal driver circuits He, so that the connection resistance between opposed terminals can be made fully small, it is also possible to determine the sizes of the conductive beads CB to be sizes large enough to provide reliable connection between the terminals of the printed circuit board PCB and those the video signal driver circuits He.

Embodiment 6

This embodiment provides a construction in which the anisotropic conductive film ACF is used for the connection between the input terminals of the video signal driver circuits He and the terminals of the printed circuit board PCB, and the surfaces of the respective terminals of the printed circuit board PCB are plated with, for example, gold (Au).

Figure 9:
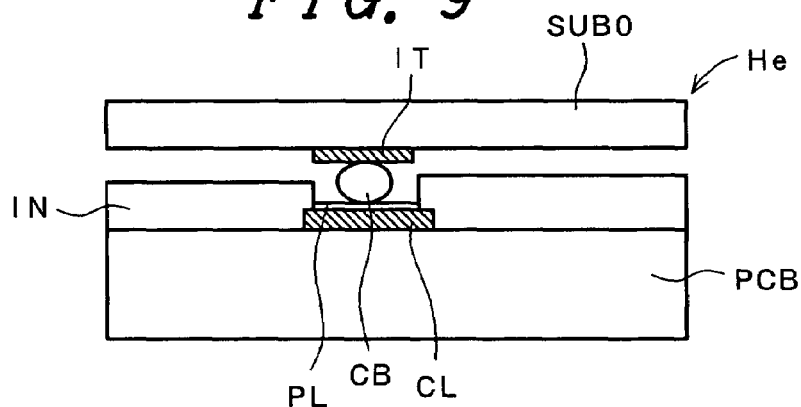
FIG. 9 is a plan view showing a portion of another embodiment of the liquid crystal display device according to the invention.

As described previously, the terminals of the printed circuit board PCB are constructed to be supplied with electric power, and electric currents flow between the terminals of the printed circuit board PCB and those of the video signal driver circuits He through locations, at each of which mutually opposed terminals are in point contact with a conductive bead contained in the anisotropic conductive film ACF, as shown in FIG. 9. As a result, an excessive current concentration easily occurs at such a location.

In addition, since the distance between each of the terminals of the printed circuit board PCB and an adjacent one is being increasingly narrower, an electric current more easily flows through an electrolytic solution such as water, which happens to be present between such terminals, so that the terminals of the printed circuit board PCB are more easily corroded by electrolytic corrosion. Accordingly, in this embodiment, a gold (Au) layer incapable of being easily oxidized (denoted by sign PL in FIG. 9) is formed on the surface of each of the terminals of the printed circuit board PCB, thereby preventing this problem and ensuring the reliability of the connection.

From this fact, it is seen that the material of the layer formed on the surface of each of the terminals of the printed circuit board PCB is not necessarily limited to Au and may also be another material, such as an ITO film that is incapable of being easily oxidized. In addition, it goes without saying that at least each of the terminals of the printed circuit board PCB may be formed of any of the above-described materials.

Embodiment 7

Figure 10:
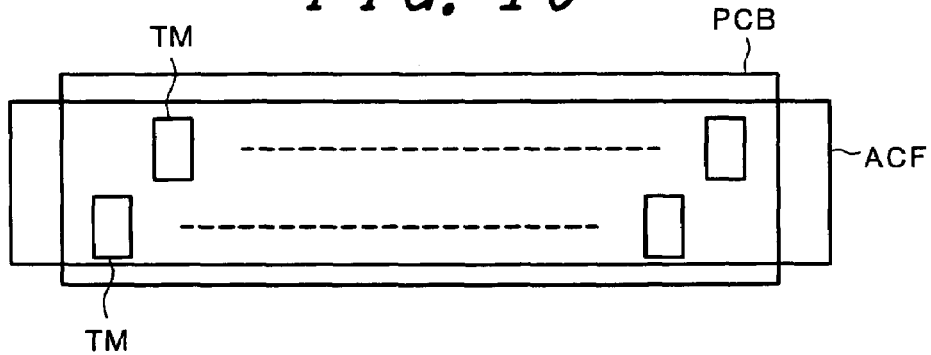
FIG. 10 is a plan view showing a portion of another embodiment of the liquid crystal display device according to the invention.

In this embodiment, terminals TM of the printed circuit board PCB are, as shown in FIG. 10, disposed in two rows in a so-called staggered arrangement, in which each of the terminals of the first row is located at a position between adjacent ones of the terminals of the second row. Accordingly, it goes without saying that the respective input terminals of the video signal driver circuits He are also arranged to correspond to the terminals of the printed circuit board PCB.

According to this arrangement, even if the terminals are disposed close to one another, it is possible to avoid an arrangement in which mutually adjacent terminals (each of the terminals of the first row and a closest one of the terminals of the second row) are disposed with their sides being opposed to each other.

This arrangement makes it possible to restrain the occurrence of electrolytic corrosion between an arbitrary one of the terminals and an adjacent one, whereby, even if electrolytic corrosion occurs, progress toward damage to a terminal can be retarded to a great extent.

That is to say, the mutually adjacent terminals are arranged in such a manner that one of the diagonal lines of the terminal of the first row and the corresponding one of the diagonal lines of the terminal of the second row are arranged to be approximately coincident with each other, and the terminals of the first and second rows can be spaced fully apart from each other, because a distance is provided between the first-row group of terminals and the second-row group of terminals. Accordingly, it is possible to restrain the occurrence of electrolytic corrosion.

For instance, even if electrolytic corrosion occurs, the electrolytic corrosion proceeds from one corner of a terminal toward an opposite corner, but the required distance (corresponding to the length of a diagonal line extending one corner of the terminal to an opposite corner) is comparatively large. Accordingly, progress of the damage to the terminal can be retarded to a great extent.

Incidentally, in the case of a construction in which individual terminals are arranged in only one row, the terminals are closely disposed with a side of each of the terminal being opposed to a side of an adjacent one.

In this case, if electrolytic corrosion occurs in any of the terminals, the electrolytic corrosion proceeds from one side of an adjacent terminal toward an opposite side. Since the width of each of the terminals is extremely small, progress of the damage to the adjacent terminal is advanced.

The above-described construction of Embodiment 7 also serves the advantage that it is possible to prevent the easy occurrence of peeling of an insulating film which covers the portion between each of the terminals and an adjacent other one. As described previously, this insulating film is formed by sticking a film-like sheet to such a portion, and if the width of the portion between adjacent openings in the insulating film is narrow, the insulating film easily peels in that portion. For this reason, the construction of Embodiment 7 is advantageous.

In addition, in this case, regarding the anisotropic conductive film ACF, which provides connection between the video signal driver circuits He and the first-row group of terminals and the second-row group of terminals on the printed circuit board PCB, it is preferable to use one anisotropic conductive film ACF, without using a plurality of anisotropic conductive films ACF, which are separated for the individual video signal driver circuits He. If such a plurality of anisotropic conductive films ACF are used, there is a case where they easily form overlaps and cause trouble, such as a defective connection.

As is apparent from the foregoing description, in accordance with the liquid crystal display device according to the invention, it is possible to provide reliable connection between semiconductor devices and printed circuit boards.

While we have shown and described several embodiments in accordance with the present invention, it is understood that the same is not limited thereto, but is susceptible of numerous changes and modifications as known to those skilled in the art, and we therefore do not wish to be limited to the details shown and described herein, but intend to cover all such changes and modifications as are encompassed by the scope of the applied claims.

What is claimed is:

1. A display device comprising:
   a display panel;
   a printed circuit board; and
   a plurality of semiconductor devices of a film carrier type which are disposed to lie between the display panel and the printed circuit board and are respectively mounted on a film carrier,
   first terminals of each of the film carrier being respectively connected to terminals of the printed circuit board by a first anisotropic conductive film, while second terminals of each of the film carrier are respectively connected to terminals of the display panel by an anisotropic conductive film,
   the first anisotropic conductive film for connecting the first terminals of each of the film carrier to the terminals of the printed circuit board being formed separately for at least each one of the semiconductor devices,
   the second anisotropic conductive film for connecting the second terminals of each of the film carrier to the terminals of the display panel being formed in common with a plurality of the film carrier.

2. A display device comprising:
   a display panel;
   a printed circuit board; and
   a plurality of semiconductor devices of a film carrier type which are disposed to lie between the display panel and the printed circuit board and are respectively mounted on a film carrier,
   first terminals of each of the film carrier being respectively connected to terminals of the printed circuit board by a first anisotropic conductive film, while second terminals of each of the film carrier are respectively connected to terminals of the display panel by a second anisotropic conductive film,
the first anisotropic conductive film for connecting the first terminals of each of the film carrier to the terminals of the printed circuit board being formed separately for at least each one of the film carrier, the second anisotropic conductive film for connecting the second terminals of each of the film carrier to the terminals of the display panel being formed separately for at least each one of the film carrier.

* * * * *